United States Patent
Karda et al.

(10) Patent No.: US 12,439,637 B2
(45) Date of Patent: Oct. 7, 2025

(54) TRANSISTORS, ARRAY OF TRANSISTORS, AND ARRAY OF MEMORY CELLS INDIVIDUALLY COMPRISING A TRANSISTOR

(71) Applicant: Micron Technology, Inc., Boise, ID (US)

(72) Inventors: Kamal M. Karda, Boise, ID (US); Haitao Liu, Boise, ID (US); Sameer Chhajed, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 740 days.

(21) Appl. No.: 17/695,634

(22) Filed: Mar. 15, 2022

(65) Prior Publication Data

US 2023/0207699 A1    Jun. 29, 2023

Related U.S. Application Data

(60) Provisional application No. 63/293,993, filed on Dec. 27, 2021.

(51) Int. Cl.
| | |
|---|---|
| *H01L 29/786* | (2006.01) |
| *H10B 12/00* | (2023.01) |
| *H10D 30/67* | (2025.01) |

(52) U.S. Cl.
CPC ......... *H10D 30/6713* (2025.01); *H10B 12/31* (2023.02); *H10D 30/6728* (2025.01)

(58) Field of Classification Search
CPC .......... H10D 30/6713; H10D 30/6728; H10D 62/206; H10D 30/0221; H10B 12/31; H10B 12/0335; H10B 12/05; A61K 40/13; A23B 80/00
See application file for complete search history.

(56) References Cited

U.S. PATENT DOCUMENTS

| | | | |
|---|---|---|---|
| 2008/0173927 A1* | 7/2008 | Sakuma | H10D 64/035 257/E21.422 |
| 2009/0032861 A1* | 2/2009 | Dong | H10D 64/037 257/E21.294 |

OTHER PUBLICATIONS

Heo et al., "Direct evidence of flat band voltage shift for TiN/LaO or ZrO/SiO2 stack structure via work function depth profiling", Scientific Reports, Mar. 2, 2017, United Kingdom, pp. 1-7.

* cited by examiner

*Primary Examiner* — Mohammed R Alam
(74) *Attorney, Agent, or Firm* — Wells St. John P.S.

(57) ABSTRACT

A transistor comprises a pair of source/drain regions having a channel region there-between. A gate is adjacent the channel region with a gate insulator being between the gate and the channel region. A fixed-charge material is adjacent the source/drain regions. Insulating material is between the fixed-charge material and the source/drain regions. The insulating material and the fixed-charge material comprise different compositions relative one another. The fixed-charge material has charge density of at least $1 \times 10^{11}$ charges/cm$^2$.

34 Claims, 7 Drawing Sheets

TRANSISTORS, ARRAY OF TRANSISTORS, AND ARRAY OF MEMORY CELLS INDIVIDUALLY COMPRISING A TRANSISTOR

RELATED PATENT DATA

This application claims priority to U.S. Provisional Patent Application Ser. No. 63/293,993, filed Dec. 27, 2021, entitled "Transistors, Array Of Transistors, And Array Of Memory Cells Individually Comprising A Transistor", naming Kamal M. Karda, Haitao Liu, and Sameer Chhajed as inventors, the disclosure of which is incorporated by reference.

TECHNICAL FIELD

Embodiments disclosed herein pertain to transistors, to arrays of transistors, ant to arrays of memory cells individually comprising a transistor.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated therefrom by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Field effect transistors are of course also used in integrated circuitry other than and/or outside of memory circuitry.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

DRAM is another type of memory.

Transistors may be used in other types of memory circuitry and in circuitry other than memory circuitry.

DETAILED DESCRIPTION OF EXAMPLE EMBODIMENTS

Figure 1:
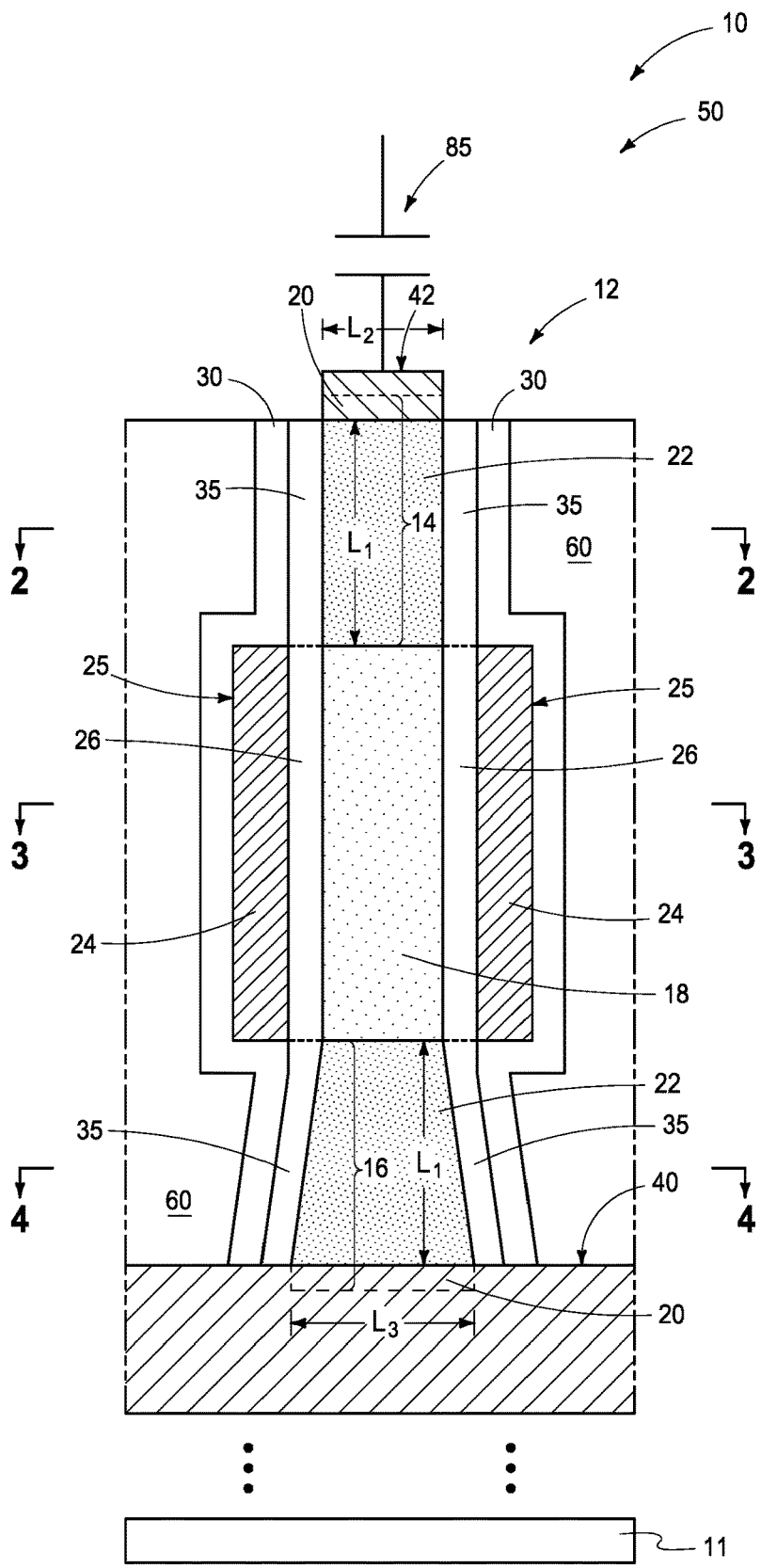
FIG. 1 is a diagrammatic cross-sectional view of a transistor and of portion of an array of memory cells in accordance with an embodiment of the invention.
Figure 2:
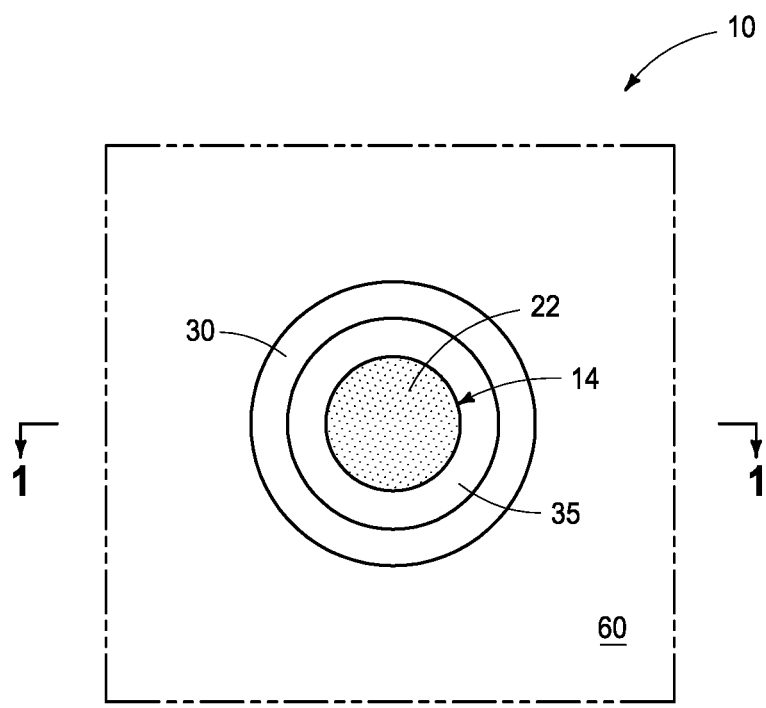
FIG. 2 is a cross-sectional view taken through line 2-2 in FIG. 1.
Figure 3:
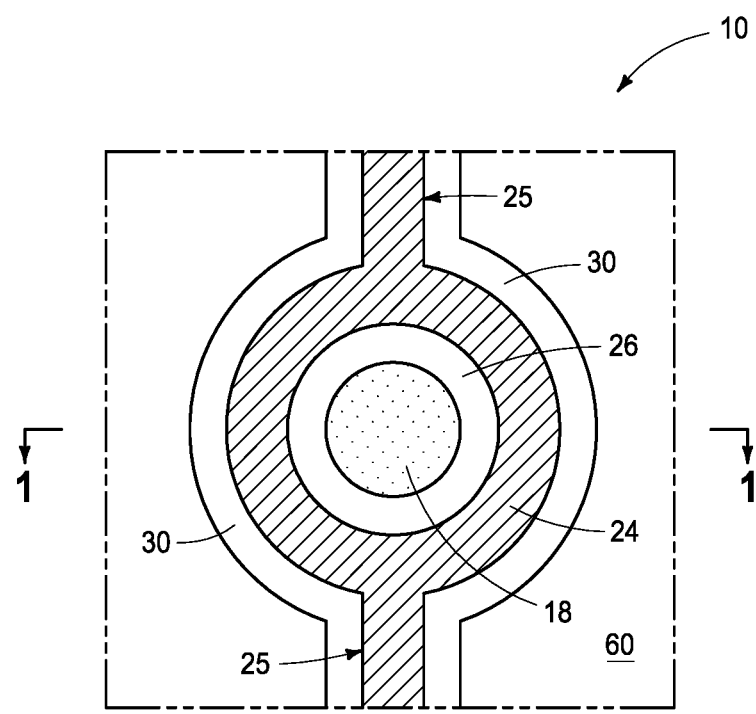
FIG. 3 is a cross-sectional view taken through line 3-3 in FIG. 1.
Figure 4:
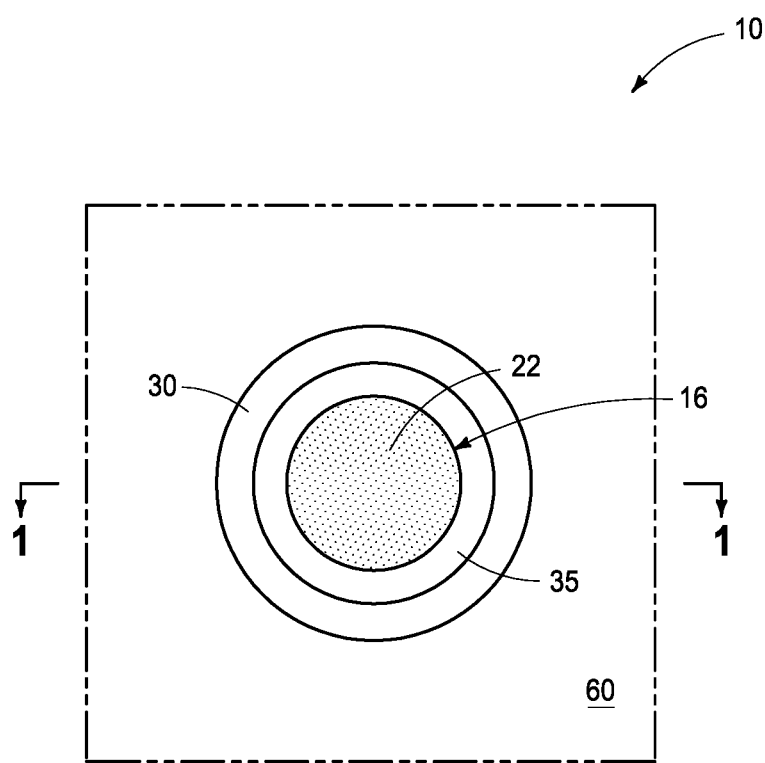
FIG. 4 is a cross-sectional view taken through line 4-4 in FIG. 1.

Embodiments of the invention encompass a transistor, including a non-volatile transistor, a semi-volatile transistor, or a volatile transistor (e.g., a volatile transistor that is devoid of any charge-storage material). Embodiments of the invention also encompass an array of transistors and a memory array (e.g., DRAM architecture, NAND architecture, etc.) comprising memory cells individually comprising a transistor.

First example embodiments of a transistor are described with reference to FIGS. 1-4 with respect to a construction 10. Such comprises a base substrate 11 that may include any one or more of conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-4-depicted materials. For example, other partially or wholly fabricated components of integrated circuitry may be provided somewhere above, about, or within base substrate 11. Control and/or other peripheral circuitry for operating components within an array of transistors may also be fabricated, and may or may not be wholly or partially within a transistor array or sub-array. Further, multiple sub-arrays may also be fabricated and operated independently, in tandem, or otherwise relative one another. In this document, a "sub-array" may also be considered as an array.

Example construction 10 comprises a transistor 12 as part of a memory cell 50. Transistor 12 comprises a pair of source/drain regions 14, 16 having a channel region 18 there-between. A gate 24 is adjacent channel region 18 and a gate insulator 26 is between gate 24 and channel region 18. In one embodiment, gate 24 is part of a wordline 25 as is described below. A fixed-charge material 30 is adjacent source/drain regions 14, 16. Insulating material 35 (e.g., silicon dioxide, silicon nitride, hafnium oxide, other high-k material, ferroelectric material, etc.) is between fixed-charge material 30 and source/drain regions 14, 16. Insulating material 35 and fixed-charge material 30 comprise different compositions relative one another. In one embodiment, gate insulator 26 and insulating material 35 are of the same composition relative one another and in another embodiment are not of the same composition relative one another. In one embodiment, fixed-charge material 30 has charge density (i.e., either positive or negative) of at least $1 \times 10^{11}$ charges/cm$^2$, in one such embodiment no greater than $1 \times 10^{14}$ charges/cm$^2$, and in one such embodiment $2 \times 10^{12}$ to $5 \times 10^{12}$ charges/cm$^2$. Herein, "charge density" with respect to "fixed-charge" material is one of "net positive charge" (i.e., total or overall charge that is positive at idle and at any operative state even though negative charges may also be present, and is also known by people of skill in the art as fixed positive charge density) or "net negative charge" (i.e., total or overall charge that is negative at idle and at any operative state even though positive charges may also be present, and is also known by people of skill in the art as fixed negative charge density). Ideally, fixed-charge material 30 is not directly against source/drain regions 14, 16 (e.g., is everywhere spaced from the source/drain regions 14, 16 by insulating material 35).

In one embodiment, source/drain regions 14, 16 individually comprise a highest-conductivity region 20 and an $L_{DD}$ region 22 between highest-conductivity region 20 and channel region 18, with insulating material 35 and fixed-charge material 30 being over $L_{DD}$ regions 22. In the example embodiment, one of highest-conductivity regions 20 (e.g., the top one) is part of a conductor or electrode 42 as described below and the other of highest-conductivity regions 20 (e.g., the bottom one) is part of a digitline 40 as described below. Regions 20 may comprise conductive metal material and/or conductively-doped semiconductive material. Regardless, in one embodiment, insulating material 35 in a vertical cross-section (e.g., that of FIG. 1) is over all of longest linear-lengths $L_1$ of $L_{DD}$ regions 22 and, in one such embodiment, fixed-charge material 30 in the vertical cross-section is over all of longest linear-lengths $L_1$ of the $L_{DD}$ regions 22. In one embodiment, insulating material 35 in the vertical cross-section is over more of longest linear-lengths $L_1$ of $L_{DD}$ regions 22 than over longest linear-lengths $L_2$, $L_3$, if any, of highest-conductivity regions 20. In one such embodiment, fixed-charge material 30 in the vertical cross-section is over more of longest linear-lengths $L_1$ of $L_{DD}$ regions 22 than over longest linear-lengths $L_2$, $L_3$, if any, of highest-conductivity regions 20 and, in one such embodiment, fixed-charge material 30 in the vertical cross-section is not over any of at least one of highest-conductivity regions 20 (e.g., top highest-conductivity region 20). In one embodiment, source/drain regions 14, 16 individually comprise conductivity-increasing dopant therein of $5 \times 10^{17}$ to $5 \times 10^{19}$ atoms/cm$^3$ and over which fixed-charge material 30 is (e.g., regardless of whether region 22 functions as an $L_{DD}$ region). An example insulative material 60 (e.g., doped or undoped silicon dioxide) is about transistor 12 and atop digitline 40.

Any other attribute(s) or aspect(s) as shown and/or described herein with respect to other embodiments may be used in the embodiments shown and described with reference to the above embodiments.

Figure 8:
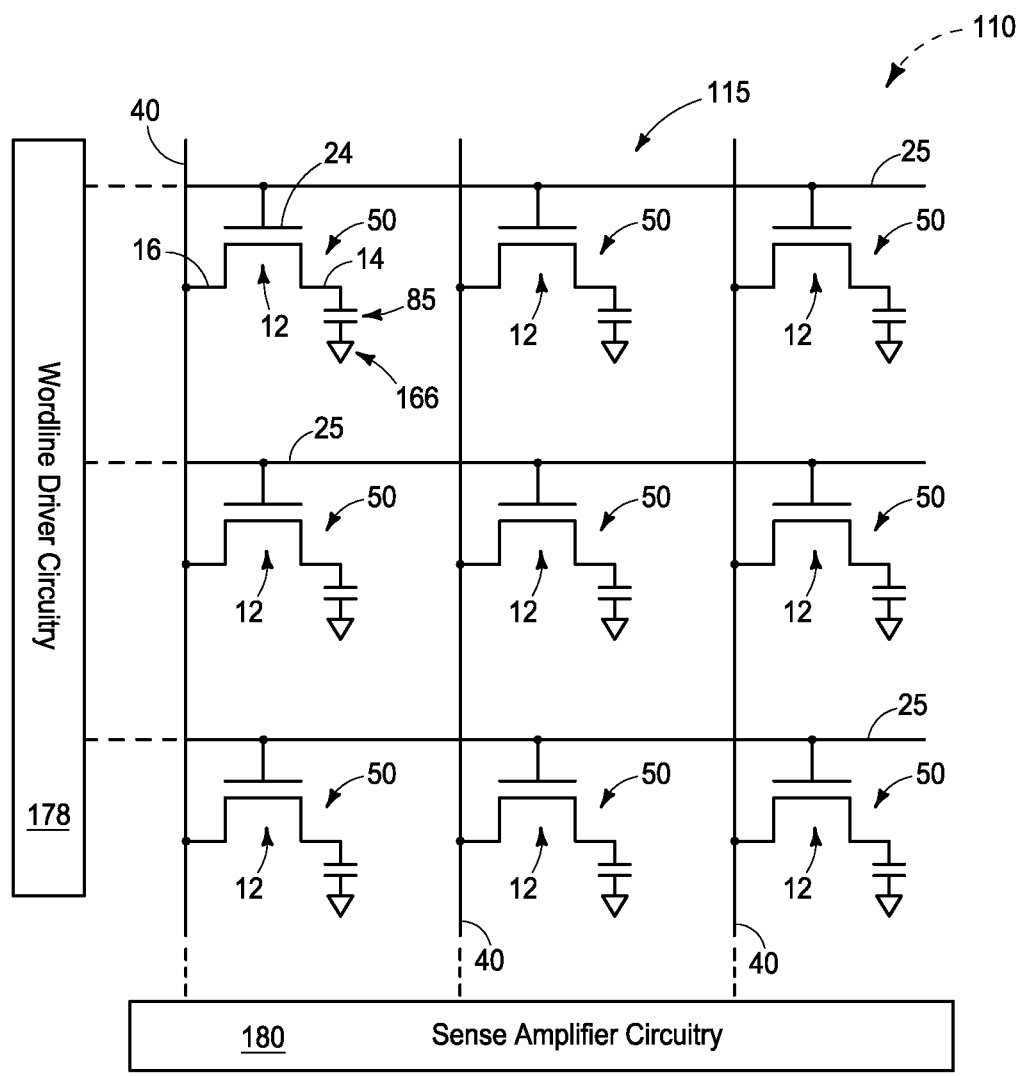
FIG. 8 is a diagrammatic schematic view of DRAM circuitry in accordance with an embodiment of the invention.

Embodiments of the invention encompass an array of transistors (e.g., 12) and an array of memory cells (e.g., 50) individually comprising a transistor (e.g., 12). By way of example, in combination with FIG. 1, FIG. 8 diagrammatically and schematically illustrates an example memory array comprising a portion of DRAM circuitry 110. Like numerals from the above-described embodiments are used. Circuitry 110 comprises a memory array 115 comprising memory cells 50 individually comprising transistor 12 and a charge-storage device 85. Gate 24 of transistor 12 is part of one of multiple wordlines 25 of memory array 115. One of the source/drain regions (e.g., 14) is electrically coupled (e.g., directly electrically coupled) to one of charge-storage devices 85. The other of the source/drain regions (e.g., 16) is electrically coupled to one of multiple digitlines 40 of memory array 115. Example charge-storage devices 85 as a capacitor has one of its electrodes (e.g., 42 in FIG. 1) directly electrically coupled to source/drain region 14 of transistor 12 and another of its electrodes directly electrically coupled to a cell plate 166. Example cell plate 166 may be at any suitable reference voltage, including by way of example, 0V, a power supply voltage $V_{CC}$, one half of $V_{CC}$, or the like, depending upon application. DRAM circuitry 115 comprises peripheral circuitry comprising, for example, wordline-driver circuitry 178 and sense/digitline-amplifier circuitry 180. Wordlines 25 extend from memory array 115 to wordline-driver circuitry 178 and digitlines 40 extend from memory array 115 to sense/digitline-amplifier circuitry 180. By way of example, the peripheral circuitry may be wholly laterally aside memory array 115. Such may be partially laterally aside memory array 115 and/or wholly or partially above or below memory array 115. Regardless, additional peripheral circuitry may be provided (not shown). Wordlines 25 and digitlines 40 individually comprise one or more conductive materials (e.g., conductive metal material and/or conductively-doped semiconductive material) and that may not be of the same composition relative one another. Any other attribute(s) or aspect(s) as shown and/or described herein with respect to other embodiments may be used.

Figure 5:
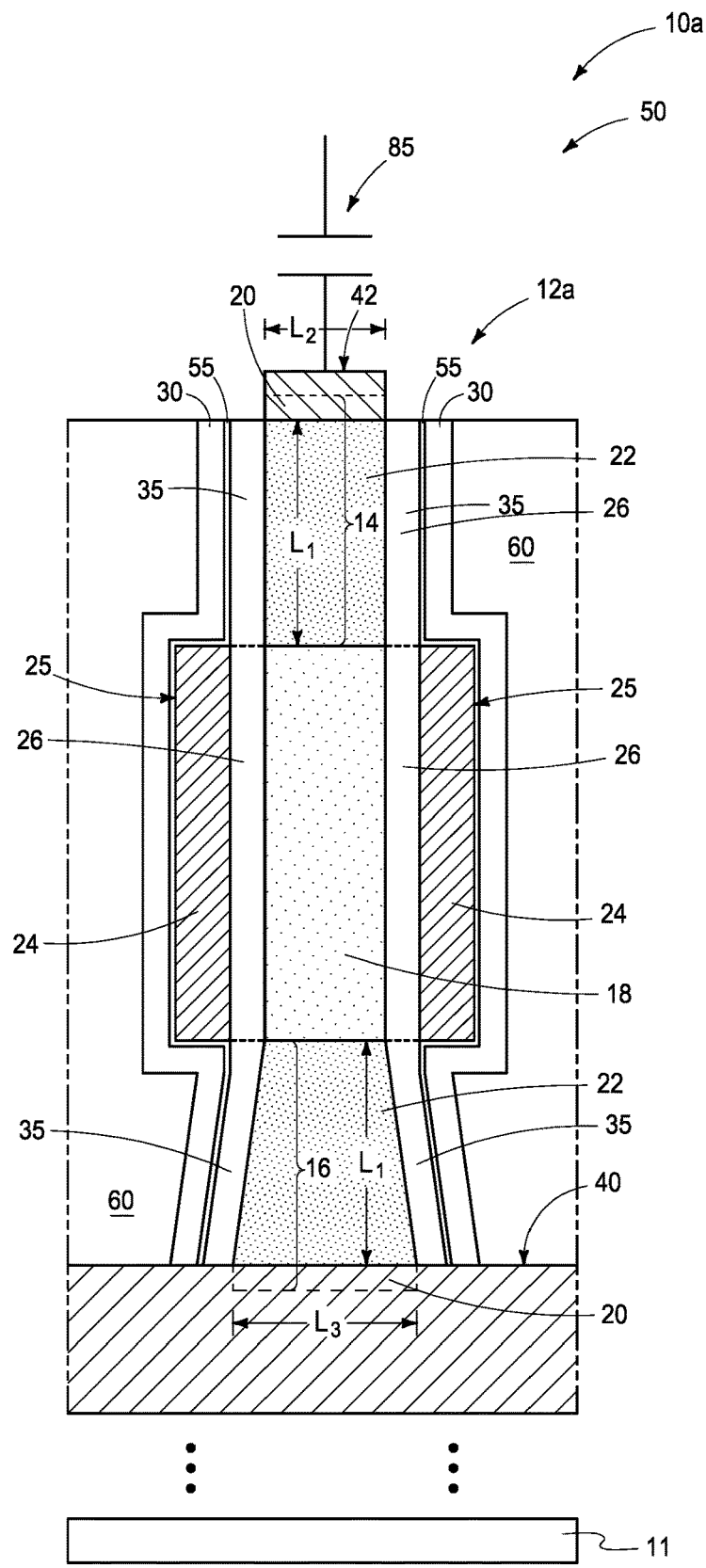
FIGS. 5-7 are diagrammatic cross-sectional views of a transistor in accordance with embodiments of the invention.

Construction 10 in FIGS. 1-4 has its fixed-charge material 30 directly against insulating material 35 and directly against gate 24. Alternately, the fixed-charge material may not be directly against one or both of such insulating material or gate, for example as shown in FIG. 5 with respect to transistor 12a of construction 10a. Like numerals from the above-described embodiments have been used where appropriate, with some construction differences being indicated with the suffix "a" or with different numerals. Example transistor 12a comprises material 55 (e.g., comprising doped or unhoped polysilicon). Any other attribute(s) or aspect(s) as shown and/or described herein with respect to other embodiments may be used.

Figure 6:
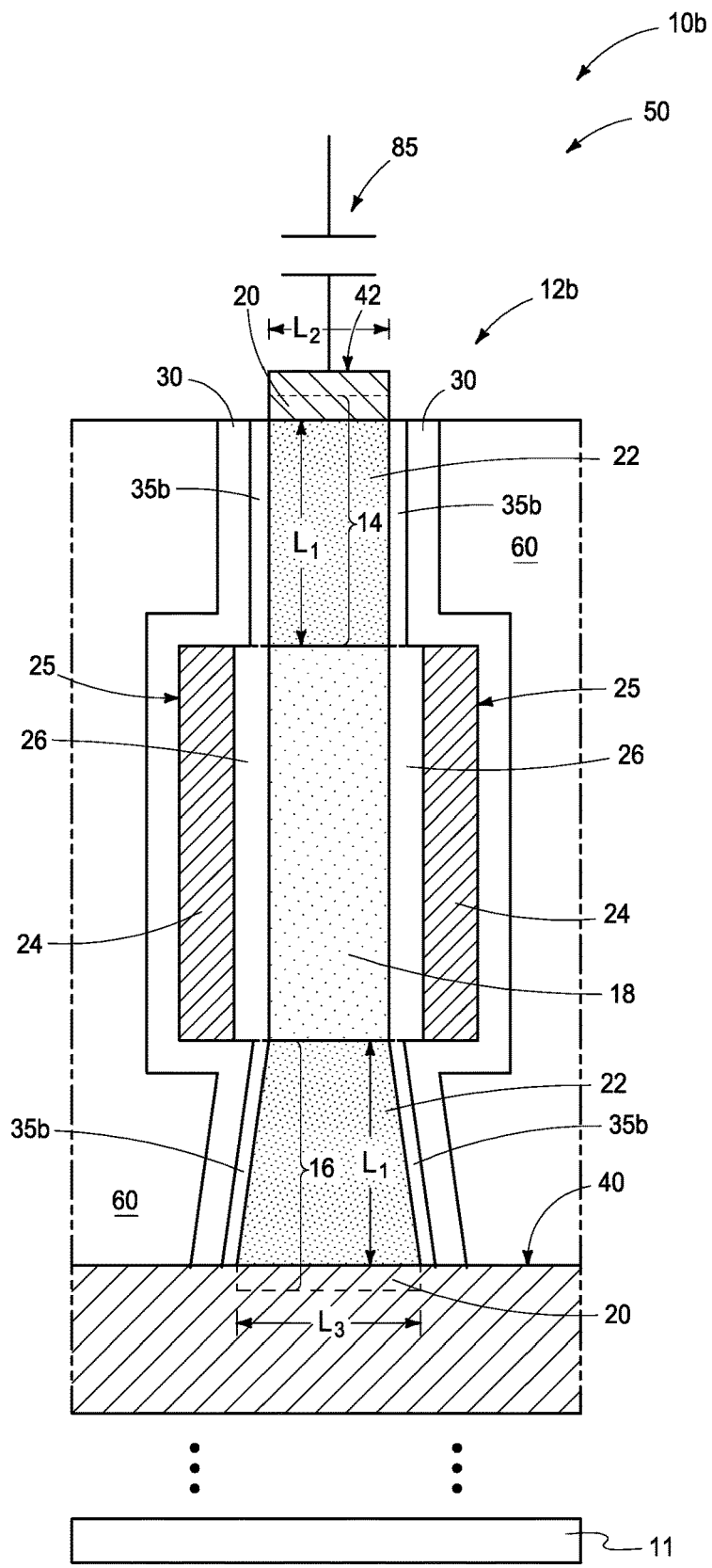

Constructions 10 and 10a in FIGS. 1-5 have gate insulator 26 and insulating material 35 of the same thickness relative one another. Alternately, the gate insulator and the insulating material are not of the same thickness relative one another, for example as shown in FIG. 6 with respect to transistor 12b of construction 10b. Like numerals from the above-described embodiments have been used where appropriate, with some construction differences being indicated with the suffix "b" or with different numerals. Example transistor 12b comprises insulating material 35b of different thickness from gate insulator 26. Less thickness is shown, although greater thickness may alternately be used. Regardless, thickness of any component in any of the embodiments need not be constant. Any other attribute(s) or aspect(s) as shown and/or described herein with respect to other embodiments may be used.

Figure 7:
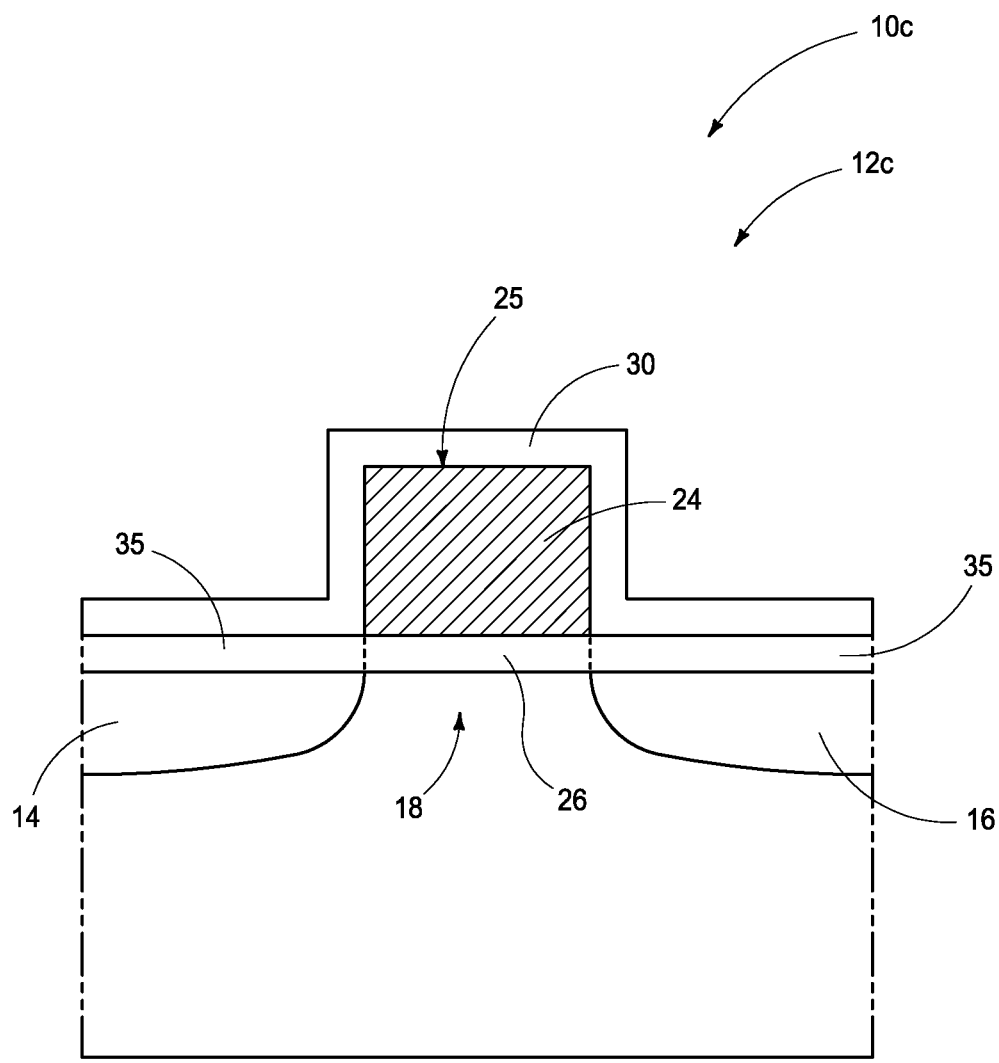

Constructions 10, 10a, and 10b in FIGS. 1-6 show their respective transistors 12, 12a, and 12b as being vertical. Alternately, as an example, a transistor in accordance with the invention may be horizontal, for example as shown in FIG. 7 with respect to transistor 12c of construction 10c. Like numerals from the above-described embodiments have been used where appropriate, with some construction differences being indicated with the suffix "c" or with different numerals. Any other attribute(s) or aspect(s) as shown and/or described herein with respect to other embodiments may be used.

In one embodiment, a transistor (e.g., 12, 12a, 12b, 12c) comprises a pair of n-type source/drain regions (e.g., 14, 16) having a channel region (e.g., 18) there-between. A gate (e.g., 18) is adjacent the channel region with a gate insulator (e.g., 26) being between the gate and the channel region. A positive fixed-charge material (e.g., 30) is adjacent the n-type source/drain regions. Insulating material (e.g., 35, 35b) is between the positive fixed-charge material and the n-type source/drain regions. The insulating material and the positive fixed-charge material comprise different compositions relative one another, with the positive fixed-charge material comprising at least one of silicon nitride and a lanthanide-series oxide. In one embodiment, the positive fixed-charge material comprises both silicon nitride and a lanthanide-series oxide. In one embodiment, the positive fixed-charge material comprises the lanthanide-series oxide and in one such embodiment comprises a silicate (e.g., lanthanum silicate) and in one embodiment comprises lanthanum oxide. Any other attribute(s) or aspect(s) as shown and/or described herein with respect to other embodiments may be used.

In one embodiment, a transistor (e.g., 12, 12a, 12b, 12c) comprises a pair of p-type source/drain regions (e.g., 14, 16) having a channel region (e.g., 18) there-between. A gate (e.g., 18) is adjacent the channel region with a gate insulator (e.g., 26) being between the gate and the channel region. A negative fixed-charge material (e.g., 30) is adjacent the p-type source/drain regions. Insulating material (e.g., 35, 35b) is between the negative fixed-charge material and the p-type source/drain regions. The insulating material and the negative fixed-charge material comprise different compositions relative one another, with the negative fixed-charge material comprising at least one of an oxide comprising at least one of zirconium, aluminum, and hafnium. In one embodiment, the negative fixed-charge material comprises a silicate of at least one of zirconium, aluminum, and hafnium. In one embodiment, the oxide of the negative fixed-charge material comprises at least two of zirconium, aluminum, and hafnium. Any other attribute(s) or aspect(s) as shown and/or described herein with respect to other embodiments may be used.

In one embodiment, a vertical transistor (e.g., 12, 12a, 12b) comprises a pair of source/drain regions (e.g., 14, 16) having a channel region (e.g., 18) there-between. The source/drain regions individually comprise a highest-conductivity region (e.g., 20) and an $L_{DD}$ region (e.g., 22) between the highest-conductivity region and the channel region. A gate (e.g., 24) is laterally-aside the channel region with a gate insulator (e.g., 26) being laterally-between the gate and the channel region. Insulating material (e.g., 35, 35b) of the same composition as that of the gate insulator extends beyond top and bottom edges of the gate to be laterally-aside the $L_{DD}$ regions. A fixed-charge material (e.g., 30) is laterally-aside the $L_{DD}$ regions. The insulating material is laterally-between the fixed-charge material and the $L_{DD}$ regions. The insulating material and the fixed-charge material comprise different compositions relative one another, with the fixed-charge material having charge density of $1\times10^{11}$ to $1\times10^{14}$ charges/cm$^2$. Any other attribute(s) or aspect(s) as shown and/or described herein with respect to other embodiments may be used.

Achieving acceptable and consistent $I_{on}$ in a field effect transistor can be adversely impacted by uncontrolled diffusion of conductivity-increasing dopant that is in source/drain regions or parts thereof. Providing of a fixed-charge material as disclosed herein may result in increased and consistent $I_{on}$ by effectively causing an electrostatic doping-effect in the source/drain regions or parts thereof where the fixed-charge material is adjacent.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

Conclusion

In some embodiments, a transistor comprises a pair of source/drain regions having a channel region there-between. A gate is adjacent the channel region with a gate insulator being between the gate and the channel region. A fixed-charge material is adjacent the source/drain regions. Insulating material is between the fixed-charge material and the source/drain regions. The insulating material and the fixed-charge material comprise different compositions relative one another. The fixed-charge material has charge density of at least $1\times10^{11}$ charges/cm$^2$.

In some embodiments, a transistor comprises a pair of n-type source/drain regions having a channel region there-between. A gate is adjacent the channel region with a gate insulator being between the gate and the channel region. A positive fixed-charge material is adjacent the n-type source/drain regions. Insulating material is between the positive fixed-charge material and the n-type source/drain regions. The insulating material and the positive fixed-charge material comprise different compositions relative one another. The positive fixed-charge material comprises at least one of silicon nitride and a lanthanide-series oxide.

In some embodiments, a transistor comprises a pair of p-type source/drain regions having a channel region there-between. A gate is adjacent the channel region with a gate insulator being between the gate and the channel region. A negative fixed-charge material is adjacent the p-type source/drain regions. Insulating material is between the negative fixed-charge material and the p-type source/drain regions. The insulating material and the negative fixed-charge material comprise different compositions relative one another. The negative fixed-charge material comprises at least one of an oxide comprising at least one of zirconium, aluminum, and hafnium.

In some embodiments, a vertical transistor comprises a pair of source/drain regions having a channel region vertically there-between. The source/drain regions individually comprise a highest-conductivity region and an $L_{DD}$ region between the highest-conductivity region and the channel region. A gate is laterally-aside the channel region with a gate insulator being laterally-between the gate and the channel region. Insulating material of the same composition as that of the gate insulator extends beyond top and bottom edges of the gate to be laterally-aside the $L_{DD}$ regions. A fixed-charge material is laterally-aside the $L_{DD}$ regions. The insulating material is laterally-between the fixed-charge material and the $L_{DD}$ regions. The insulating material and the fixed-charge material comprise different compositions relative one another. The fixed-charge material has charge density of $1\times10^{11}$ to $1\times10^{14}$ charges/cm$^2$.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A transistor comprising:
a pair of source/drain regions having a channel region there-between;
a gate adjacent the channel region with a gate insulator being between the gate and the channel region, the gate having an external surface that is not between the gate and the channel region;
a fixed-charge material that is along the external surface of the gate and that is adjacent the source/drain regions; and
insulating material between the fixed-charge material and the source/drain regions, the insulating material and the fixed-charge material comprising different compositions relative one another, the fixed-charge material having charge density of at least $1\times10^{11}$ charges/cm$^2$.

2. The transistor of claim 1 wherein the fixed-charge material has charge density no greater than $1\times10^{14}$ charges/cm$^2$.

3. The transistor of claim 1 wherein the fixed-charge material has charge density of $2\times10^{12}$ to $5\times10^{12}$ charges/cm$^2$.

4. The transistor of claim 1 wherein the source/drain regions individually comprise conductivity-increasing dopant therein of $5\times10^{17}$ to $5\times10^{19}$ atoms/cm$^3$ and adjacent which the fixed-charge material is.

5. A transistor comprising:
a pair of source/drain regions having a channel region there-between;
a gate adjacent the channel region with a gate insulator being between the gate and the channel region;
a fixed-charge material adjacent the source/drain regions;
insulating material between the fixed-charge material and the source/drain regions, the insulating material and the fixed-charge material comprising different compositions relative one another, the fixed-charge material having charge density of at least $1\times10^{11}$ charges/cm$^2$; and
the source/drain regions individually comprising a highest-conductivity region and an $L_{DD}$ region between the highest-conductivity region and the channel region, the insulating material and the fixed-charge material being over the $L_{DD}$ regions.

6. The transistor of claim 5 wherein the insulating material in a vertical cross-section is over all of longest linear-lengths of the $L_{DD}$ regions.

7. The transistor of claim 6 wherein the fixed-charge material in the vertical cross-section is over all of the longest linear-lengths of the $L_{DD}$ regions.

8. The transistor of claim 5 wherein the insulating material in a vertical cross-section is over more of longest linear-lengths of the $L_{DD}$ regions than over longest linear-lengths, if any, of the highest-conductivity regions.

9. The transistor of claim 8 wherein the fixed-charge material in the vertical cross-section is over more of the longest linear-lengths of the $L_{DD}$ regions than over the longest linear-lengths, if any, of the highest-conductivity regions.

10. The transistor of claim 9 wherein the fixed-charge material in the vertical cross-section is not over any of at least one of the highest-conductivity regions.

11. The transistor of claim 1 wherein the fixed-charge material is directly against the insulating material.

12. The transistor of claim 1 wherein the fixed-charge material is not directly against the insulating material.

13. A transistor comprising:
a pair of source/drain regions having a channel region there-between;
a gate adjacent the channel region with a gate insulator being between the gate and the channel region;
a fixed-charge material adjacent the source/drain regions;
insulating material between the fixed-charge material and the source/drain regions, the insulating material and the fixed-charge material comprising different compositions relative one another, the fixed-charge material having charge density of at least $1\times10^{11}$ charges/cm$^2$; and
the fixed-charge material being directly against the gate.

14. The transistor of claim 1 wherein the fixed-charge material is not directly against the gate.

15. The transistor of claim 1 wherein the fixed-charge material is not directly against the source/drain regions.

16. A transistor comprising:
a pair of source/drain regions having a channel region there-between;
a gate adjacent the channel region with a gate insulator being between the gate and the channel region;
a fixed-charge material adjacent the source/drain regions;

insulating material between the fixed-charge material and the source/drain regions, the insulating material and the fixed-charge material comprising different compositions relative one another, the fixed-charge material having charge density of at least $1\times10^{11}$ charges/cm$^2$; and the gate insulator and the insulating material being of the same composition relative one another.

17. The transistor of claim 1 wherein the gate insulator and the insulating material are not of the same composition relative one another.

18. The transistor of claim 1 wherein the gate insulator and the insulating material are of the same thickness relative one another.

19. The transistor of claim 1 wherein the gate insulator and the insulating material are not of the same thickness relative one another.

20. A transistor comprising:
a pair of source/drain regions having a channel region there-between;
a gate adjacent the channel region with a gate insulator being between the gate and the channel region;
a fixed-charge material adjacent the source/drain regions;
insulating material between the fixed-charge material and the source/drain regions, the insulating material and the fixed-charge material comprising different compositions relative one another, the fixed-charge material having charge density of at least $1\times10^{11}$ charges/cm$^2$; and
the transistor being vertical.

21. The transistor of claim 1 wherein the transistor is horizontal.

22. A transistor comprising:
a pair of source/drain regions having a channel region there-between;
a gate adjacent the channel region with a gate insulator being between the gate and the channel region;
a fixed-charge material adjacent the source/drain regions;
insulating material between the fixed-charge material and the source/drain regions, the insulating material and the fixed-charge material comprising different compositions relative one another, the fixed-charge material having charge density of at least $1\times10^{11}$ charges/cm$^2$; and
the transistor being volatile.

23. An array of transistors, the transistors individually comprising the transistor of claim 1.

24. An array of memory cells, the memory cells individually comprising the transistor of claim 1.

25. A transistor comprising:
a pair of n-type source/drain regions having a channel region there-between;
a gate adjacent the channel region with a gate insulator being between the gate and the channel region, the gate having an external surface that is not between the gate and the channel region;
a positive fixed-charge material that is along the external surface of the gate and that is adjacent the n-type source/drain regions; and
insulating material between the positive fixed-charge material and the n-type source/drain regions, the insulating material and the positive fixed-charge material comprising different compositions relative one another, the positive fixed-charge material comprising at least one of silicon nitride and a lanthanide-series oxide.

26. A transistor comprising:
a pair of p-type source/drain regions having a channel region there-between;
a gate adjacent the channel region with a gate insulator being between the gate and the channel region;
a negative fixed-charge material adjacent the p-type source/drain regions; and
insulating material between the negative fixed-charge material and the p-type source/drain regions, the insulating material and the negative fixed-charge material comprising different compositions relative one another, the negative fixed-charge material comprising at least one of an oxide comprising at least one of zirconium, aluminum, and hafnium.

27. A vertical transistor comprising:
a pair of source/drain regions having a channel region vertically there-between, the source/drain regions individually comprising a highest-conductivity region and an $L_{DD}$ region between the highest-conductivity region and the channel region;
a gate laterally-aside the channel region with a gate insulator being laterally-between the gate and the channel region, insulating material of the same composition as that of the gate insulator extending beyond top and bottom edges of the gate to be laterally-aside the $L_{DD}$ regions;
a fixed-charge material laterally-aside the $L_{DD}$ regions, the insulating material being laterally-between the fixed-charge material and the $L_{DD}$ regions; and
the insulating material and the fixed-charge material comprising different compositions relative one another, the fixed-charge material having charge density of $1\times10^{11}$ to $1\times10^{14}$ charges/cm$^2$.

28. The transistor of claim 5 wherein the gate has an external surface that is not between the gate and the channel region, the fixed-charge material being along the external surface of the gate.

29. The transistor of claim 13 wherein the gate has an external surface that is not between the gate and the channel region, the fixed-charge material being along the external surface of the gate.

30. The transistor of claim 16 wherein the gate has an external surface that is not between the gate and the channel region, the fixed-charge material being along the external surface of the gate.

31. The transistor of claim 20 wherein the gate has an external surface that is not between the gate and the channel region, the fixed-charge material being along the external surface of the gate.

32. The transistor of claim 22 wherein the gate has an external surface that is not between the gate and the channel region, the fixed-charge material being along the external surface of the gate.

33. The transistor of claim 26 wherein the gate has an external surface that is not between the gate and the channel region, the negative fixed-charge material being along the external surface of the gate.

34. The transistor of claim 27 wherein the gate has an external surface that is not between the gate and the channel region, the negative fixed-charge material being along the external surface of the gate.

* * * * *